United States Patent [19]

Shields et al.

[11] Patent Number: 4,489,479

[45] Date of Patent: Dec. 25, 1984

[54] METHOD FOR REPAIR OF BURIED CONTACTS IN MOSFET DEVICES

[75] Inventors: Steven E. Shields, San Diego; David A. Robinson, Oceanside, both of Calif.

[73] Assignee: Hughes Aircraft Company, Culver City, Calif.

[21] Appl. No.: 528,495

[22] Filed: Sep. 1, 1983

[51] Int. Cl.³ .............................................. H01L 21/88
[52] U.S. Cl. ................................. 29/575; 29/577 C; 29/591; 357/59; 357/67
[58] Field of Search ..................... 29/571, 577 C, 575, 29/590, 591; 357/65, 67, 67 S, 59

[56] References Cited

U.S. PATENT DOCUMENTS 3,806,361  4/1974  Lehner ....................... 148/187 X
4,271,424  6/1981  Inayoshi et al. ................ 357/67
4,335,502  6/1982  Richman ........................ 29/571

Primary Examiner—Brian E. Hearn
Assistant Examiner—Alan E. Schiavelli
Attorney, Agent, or Firm—Joseph E. Szabo; William J. Bethurum; Anthony W. Karambelas

[57] ABSTRACT

Contacts between polysilicon conductors on the surface of a silicon wafer and doped regions underlying them in the wafer, rendered defective by the growth of a thin intervening oxide layer between conductors and diffusions, are repaired by depositing dots of aluminum on the conductors in the contact areas and annealing the wafer so as to drive traces of the aluminum through the conductors and the intervening oxide into the underlying doped regions in the wafer.

6 Claims, 6 Drawing Figures

METHOD FOR REPAIR OF BURIED CONTACTS IN MOSFET DEVICES

The Government has rights in this invention pursuant to Contract No. F33615-79-C-1887 awarded by the Air Force.

BACKGROUND OF THE INVENTION

1. Field of the Invention

The subject invention relates generally to integrated circuits and more particularly to the provision of operative contacts in MOSFET devices.

2. Description of the Prior Art

Metal oxide semiconductor field-effect transistor (MOSFET) devices are characterized by a silicon substrate having a pair of diffusions separated by a channel over which a conductive gate extends. Conduction between the diffusions is controlled by application of a control voltage to the gate. Although initially the gate was formed of metal, more recently doped silicon has also been used for this purpose. The present invention is directed at both types of MOSFET devices, although it will probably be found particularly useful with silicon gate MOSFET devices.

In devices of the above type, contact between various portions of circuits in the substrate is established by means of conductors extending over the surface of the silicon, these conductors advantageously being formed of polycrystalline silicon in a manner well known to those skilled in the art. This is particularly convenient where the control gates are also formed of polycrystalline silicon.

In order to make the necessary interconnections, it is often advantageous to make a number of contacts between the polycrystalline silicon conductor and the substrate. This is done by forming doped (and hence relatively highly conductive) regions in the substrate surface, covering the surface with a masking oxide layer, creating openings in that layer so as to expose a portion of each conductive region, depositing a polycrystalline silicon layer so that it extends through the openings to establish electrical contact to the doped regions and patterning the layer into individual polycrystalline conductors. The type of contact thus formed is usually referred to as a "buried" contact, and will be so referred to herein.

During the processing steps which precede the deposition of the polycrystalline silicon layer, a thin oxide layer tends to form over the doped regions where they are exposed through the openings in the masking oxide layer. This does not create a problem where the interconnection which is to extend into contact with a doped region is made of aluminum, as is sometimes the case. This is so because the aluminum will be driven through such a thin oxide layer (on the order of 50 angstroms) during subsequent annealing steps. However, where the interconnection is made of polycrystalline silicon, which will usually be the material of choice for the interconnections when the control gates of the devices are themselves made of polycrystalline silicon, the intervening thin oxide layer may block conduction. As a result, when a wafer is fabricated with a large number of doped regions to which contact is to be made from a number of polycrystalline silicon conductors extending over the surface of the wafer, a significant number of defective contacts may be formed.

The problem just described, while usually occurring with wafers which are formed of silicon throughout, may also occur on wafers of other semiconductor materials, and where silicon or another semiconductor is deposited on an insulator such as sapphire or glass, with the MOSFET devices being formed in the thin semiconductor layer which is mechanically supported on the underlying insulating substrate.

It is the principal object of the present invention to overcome the problem of defective contacts in MOSFET devices formed in silicon wafers.

A closely related object of the invention is to provide a technique whereby defective contacts may be readily repaired, so as to render them fully operative.

SUMMARY OF THE INVENTION

These and other objects of the invention are achieved by a method of repairing a defective contact, or a plurality of them, in a semiconductor wafer of integrated circuits wherein the contacts are initially formed between defined areas of a layer of first conductive material which extends over a surface of the wafer and corresponding regions of second conductive material in the wafer underlying the defined areas. In accordance with the invention, a dot of a third conductive material is deposited on the layer of first conductive material in the defined areas, after which the wafer is annealed so as to drive the third conductive material into the regions of second conductive material through the layer of first conductive material and through any undesirably intervening insulating layer formed between the regions of second conductive material and the layer of first conductive material during previous processing steps.

In the context of the above example used to explain the problem solved by the invention, the following specific materials would correspond to the more general terms used to summarize the invention: semiconductor—silicon; first conductive material—polycrystalline silicon; second conductive material—doped region in the silicon wafer; third conductive material—aluminum; insulating layer—silicon dioxide.

DETAILED DESCRIPTION OF THE INVENTION

Figure 1:
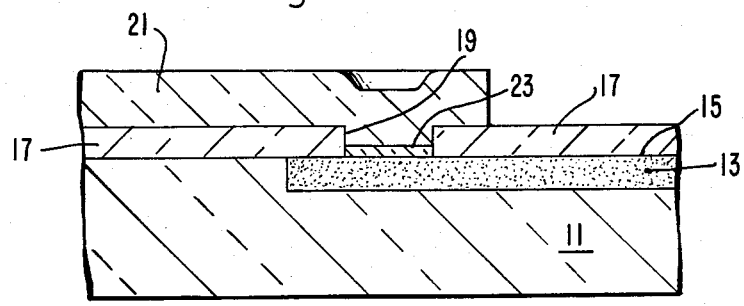
FIG. 1 is a cross-section through a wafer containing an integrated circuit in which an imperfect contact is made between a diffusion in the semiconducting substrate and an overlying polycrystalline conductor due to an intervening thin oxide layer.
Figure 2:
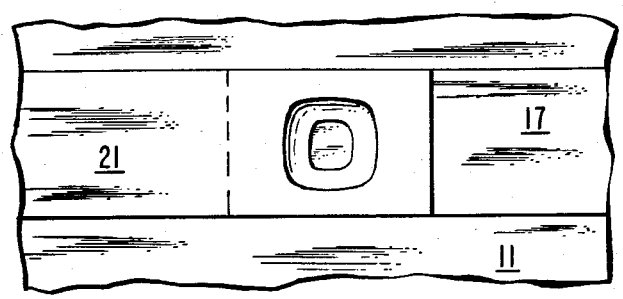
FIG. 2 is a plan view of the defective contact shown in FIG. 1.
Figure 3:
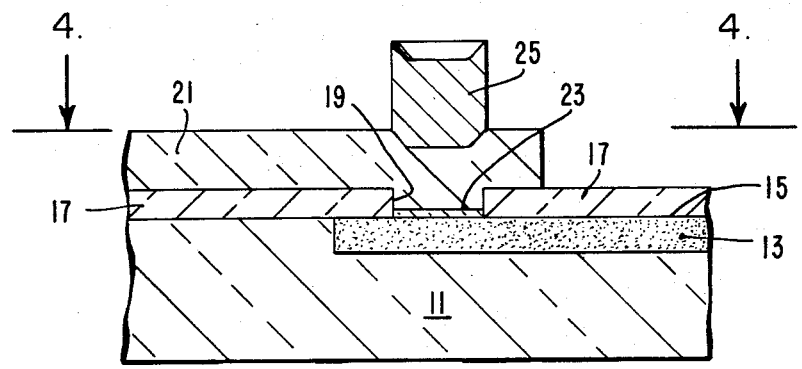
FIG. 3 is a cross-sectional view of the defective contact illustrated in FIGS. 1 and 2, with a dot of aluminum placed over the defective contact area during an initial step of the present invention.
Figure 4:
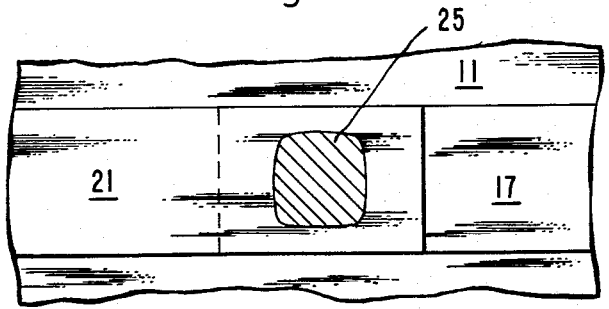
FIG. 4 is a plan view of the process step illustrated in FIG. 3.

FIG. 1 illustrates a small portion of a wafer of integrated circuits containing a contact rendered defective by the formation of a thin oxide layer over the diffusion to which a contact was to be made. It should be understood that a typical wafer will contain many contact areas of the type illustrated in FIG. 1. As shown in FIG. 1, the integrated circuit wafer comprises a silicon substrate 11 having a surface 15 overlayed by an oxide layer 17. In the surface 15 of the wafer 11 is a doped region 13 which is more highly conductive than the rest of the substrate 11. Access to the doped region 13 is through an opening 19 formed through the oxide layer 17 by conventional photochemical steps. These steps (not illustrated) include the deposition of a photoresist layer over the oxide layer 17, the placing of a mask over the oxide layer 17, with the mask having a pattern of openings corresponding to the openings 19 which are to be formed, the exposure of the photoresist layer through the mask to light, the formation of openings in the photoresist as a result of exposure of these areas to light, and the formation of the openings 19 by etching under the control of the now-patterned photoresist layer 17.

Through a similar series of conventional steps (also not illustrated), a pattern of polycrystalline conductors 21 is formed over the wafer, these steps including the deposition of a layer of polycrystalline silicon and the formation of a mask on top of the polycrystalline silicon layer, followed by an etching step controlled and guided by the delineation of the mask so as to leave behind the desired pattern of conductors 21 over the surface of the silicon wafer. Contacts between the individual polycrystalline silicon conductors 21 and doped regions 13 are, thus, automatically established through the preformed openings 19 which provide defined regions in the polycrystalline layer between which such contacts are established with the diffusions in the substrate.

During the fabricating steps just described, a thin layer 23 of silicon dioxide, on the order of 50 angstroms, may form over the surface 15 of the substrate 11 in the openings 19 thorugh which contact is desired to be established. The formation of such an insulating layer will normally render the contact between the diffusion 13 and the conductor 21 defective. In accordance with the present invention, such a defective contact may be repaired by depositing a dot of aluminum 25 over the region defined by the opening 19 and then annealing the silicon wafer so as to drive the aluminum from the dot 25 through the underlying layers of polycrystalline silicon 21 and the intervening oxide 23 into the doped region 13 so as to establish a conductive path between the polycrystalline silicon conductor 21 and the underlying doped region 13 through the intervening thin oxide layer 23. Preferably the aluminum dots (since there will usually be several, the process will be so described) are defined by means of a mask having openings which correspond to the locations of at least those openings 19 in the oxide layer 17 in which an intervening thin oxide layer 23 has formed. To locate the aluminum dots 25 over the defined contact regions of the polycrystalline conductor 21, a photoresist layer is first formed over the surface of the wafer, after which the mask is placed over the photoresist layer and, by standard photochemical steps, openings are created therein. Thereafter, a layer of aluminum is deposited over the patterned photoresist layer, with the latter now having openings corresponding to the location of the openings 19, causing the aluminum dots 25 to be deposited over those areas as desired. The excess aluminum may be then lifted off the surface of the wafer so as to leave in place only the now properly located aluminum dots 25. The process is concluded by subjecting the wafer to annealing, causing traces 27 of the aluminum from the dots 25 to penetrate through the intervening oxide layer 23 into the underlying diffusion 13.

Advantageously, the same mask which was originally used to define the contact areas by delineating the contact openings 19 is also used to locate the aluminum dots 25 in the subsequent step, during which those dots are formed. This assures accurate registration of the aluminum dots 25 with the contact areas defined by the openings 19. In so executing the steps of the present invention, aluminum dots 25 are formed over all of the polycrystalline silicon-to-doped region contacts of the wafer, not just to those that are defective. This, however, is not a drawback since the aluminum traces 27 do not impair the quality of an originally operative contact.

Figure 5:
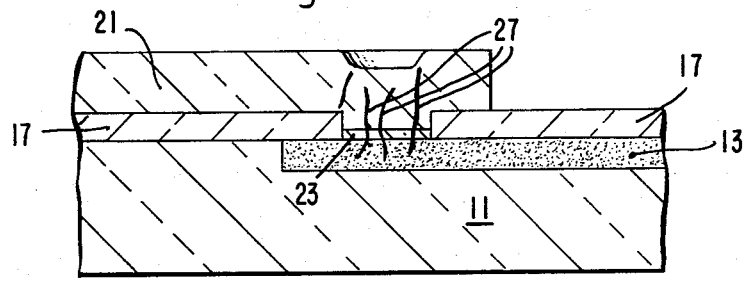
FIG. 5 illustrates a subsequent step of the inventive process in which aluminum has been driven through the polycrystalline conductor and through the interfering oxide layer into an underlying doped region.
Figure 6:
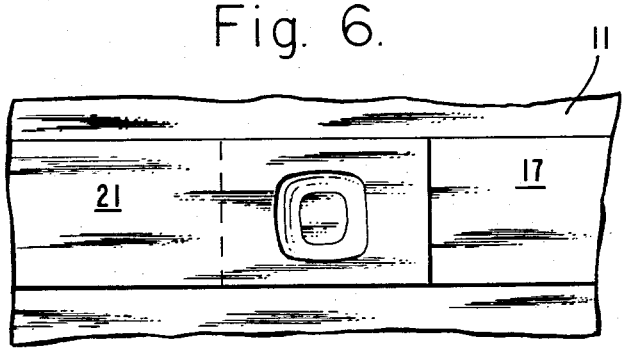
FIG. 6 is a plan view of the process step illustrated in FIG. 5.

In carrying out the invention with a particular wafer which had defective contacts that needed to be repaired, a one-micron layer of aluminum was deposited over the wafer after it had been coated with a photoresist, and the photoresist exposed using the contact mask which had previously been used to define the contact areas as just explained. After removal of the photoresist, along with the aluminum layer in all but the contact areas so as to leave in place an array of aluminum dots 25, the wafer was cleaned and annealed at 450° C. in forming gas (a mixture of nitrogen and hydrogen) for 45 minutes. As a result, the aluminum moves preferentially through the polycrystalline silicon layer 21 and through the intervening thin oxide layer 23, as shown in FIG. 5. Following removal of the remaining leftover traces of the aluminum dots 25, all subsequent processing steps were carried out at a sufficiently low temperature to insure that the aluminum traces 27 did not penetrate beyond the diffusion 13 into the substrate 11.

The technique just described has been found to be very effective in repairing defective contacts, so long as the intervening oxide layer is not too thick. Beyond a certain thickness of the intervening oxide layer, the penetration of the aluminum traces therethrough is insufficient to provide sufficient conduction into the underlying doped contact region. This thickness is estimated to be about 75 to 100 angstroms. It will be recognized, however, that the technique may be found to be effective with even greater thicknesses, depending upon factors such as the temperature and length of the annealing step and the precise nature of the oxide layer.

The foregoing technique is directly applicable to other semiconductor device processes which involve silicon-to-silicon electrical contacts, such as polysilicon interconnects on silicon-on-sapphire parts. It should also be applicable to thin film transistor technology using such contacts. In general, the following conditions are believed to establish the situations where the process will be found to be effective:

(1) The device structure contains an electrical contact between two conductive materials, which is rendered inoperative due to a thin intervening layer of an insulator; and (2) There exists a third conductive material which
  (a) moves through the uppermost layer of the defective structure easily,
  (b) is chemically capable of reducing the intervening insulator, and
  (c) is capable of good electrical contact with both of the conductive materials in the original device structure.

Under these conditions defective contacts between the two materials in the original structure may be repaired through introduction of the third material and subsequent thermal processing.

In the preferred embodiment described herein, the two conductive materials in the device structure are polycrystalline silicon over single crystal silicon, the intervening insulator is silicon dioxide, and the third conductive material is aluminum.

What is claimed is:

1. A method of overcoming the effect of an undesirably intervening oxide layer in a silicon wafer of integrated circuits between a defined conductive area of a layer of polycrystalline silicon which extends over a surface of said wafer and a doped region in said wafer underlying said defined area, said oxide layer interfering with the creation of a contact between said polycrystalline silicon and said doped region in said defined area, comprising the steps of:
   (a) depositing a dot of aluminum on said polycrystalline silicon layer on said defined area; and
   (b) annealing said wafer at an elevated temperature so as to drive said aluminum into said doped region through said polycrystalline silicon layer and through said undesirably intervening oxide layer.

2. The method of claim 1 characterized in that said silicon wafer of integrated circuits includes a plurality of contacts of which some are defective and in that said step of depositing a dot of aluminum includes the steps of:
   (a) forming a masking layer over said polycrystalline silicon layer, patterned with openings which overlie at least said defective contacts; and
   (b) selectively depositing said aluminum through said mask opening onto said defective contacts.

3. The method of claim 2 characterized further in that said masking layer is formed by depositing a photoresist layer over said wafer and selectively exposing it to radiation through a mask patterned with openings corresponding to the location of said contacts.

4. The method of claim 3 including the additional step of removing residues of said aluminum from the wafer after said annealing step and limiting the temperatures to which said device is subjected during subsequent processing steps to those below the temperature at which said aluminum is further driven through said doped region into said silicon wafer.

5. The method of claim 1 characterized further in that said silicon wafer of integrated circuits includes a plurality of contacts only some of which are defective and in that during said depositing step dots of aluminum are formed on operative as well as defective contacts on said wafer so that, during said step of annealing, said aluminum is driven into doped regions underlying both operative and defective contacts.

6. The method of claim 5 characterized further in that a common mask is used both to establish the defined areas of said polycrystalline layer and to locate the dots of aluminum which are deposited over said areas.

* * * * *